US005387499A

United States Patent [19]

Earle et al.

[11] Patent Number: 5,387,499

[45] Date of Patent: Feb. 7, 1995

[54] METHOD AND APPARATUS FOR PHOTOGRAPHIC PROCESSING

[75] Inventors: Anthony Earle, Harrow Weald; James I. Dunlop, Harrow; Edward C. T. S. Glover, London; Peter D. Marsden, North Harrow, all of Great Britain; Roger Baretll, Rochester, N.Y.

[73] Assignee: Eastman Kodak Company, Rochester, N.Y.

[21] Appl. No.: 920,299

[22] PCT Filed: Feb. 11, 1991

[86] PCT No.: PCT/EP91/00266

§ 371 Date: Aug. 14, 1992

§ 102(e) Date: Aug. 14, 1992

[87] PCT Pub. No.: WO91/12567

PCT Pub. Date: Aug. 22, 1991

[30] Foreign Application Priority Data

Feb. 14, 1990 [GB] United Kingdom ................. 9003282

[51] Int. Cl.[6] .......................... C03C 5/30; C03C 5/31; G03F 3/02

[52] U.S. Cl. .................................... 430/399; 430/403; 430/373; 430/414; 430/943; 354/320; 354/321; 354/324; 354/338

[58] Field of Search ............... 430/398, 399, 400, 403, 430/373, 943, 414; 354/317, 320, 321, 324, 338

[56] References Cited

U.S. PATENT DOCUMENTS

| | | | |
|---|---|---|---|
| 2,186,927 | 1/1940 | Hughey | 354/338 |
| 4,954,425 | 9/1990 | Iwano | 430/373 |
| 5,043,756 | 8/1991 | Takabayashi et al. | 354/320 |
| 5,179,404 | 1/1993 | Bartell et al. | 354/320 |

FOREIGN PATENT DOCUMENTS

| | | |
|---|---|---|
| 2622708 | 11/1987 | France . |
| 9013061 | 11/1990 | . |

OTHER PUBLICATIONS

Patent Abstracts of Japan, vol. 13, No. 242, (P-880) (3590), 7 Jun. 1989, and JP, A, 144938 ()Fuji Photo Film(. Ltd.) 17 February 1989 cited in the application.

*Primary Examiner*—Janet C. Baxter
*Assistant Examiner*—Mark F. Huff
*Attorney, Agent, or Firm*—Frank Pincelli

[57] ABSTRACT

A method of processing an imagewise exposed photographic material in a processing solution which is unstable to the extent that it deteriorates without external reaction in which the photographic material is passed through a tank containing the solution characterized in that the solution is circulated through the tank at a rate of from 0.1 to 10 tank volumes per minute.

20 Claims, 2 Drawing Sheets

FIG. 1.
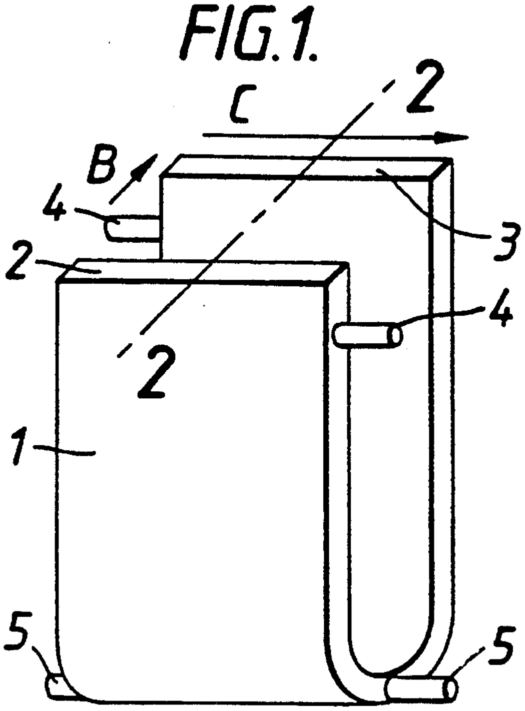
FIG. 2.
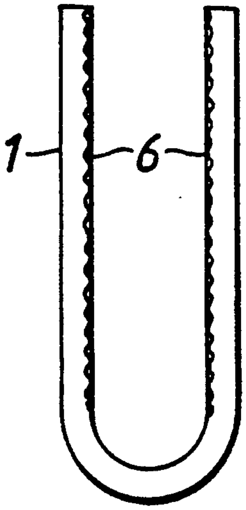
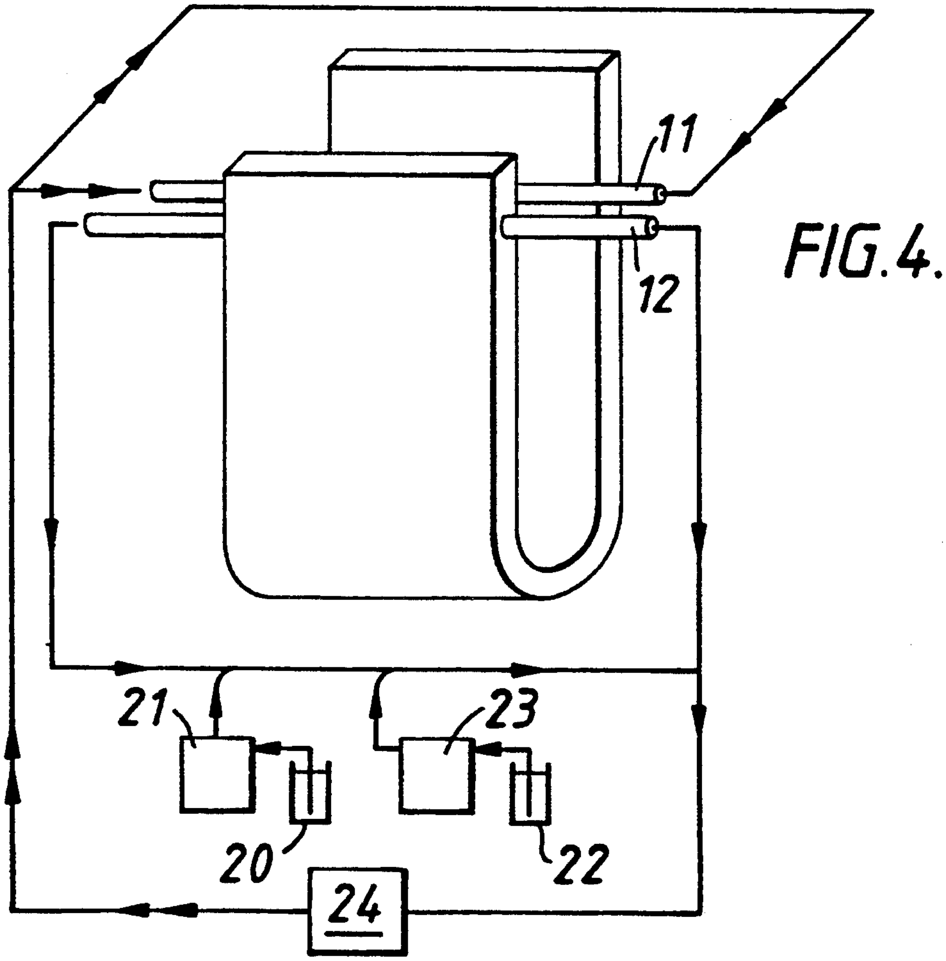
FIG. 4.

METHOD AND APPARATUS FOR PHOTOGRAPHIC PROCESSING

This invention relates to a method of photographic processing and to apparatus useful therefor.

Conventional colour photographic silver halide materials are processed by a process which includes a colour development step. In this step silver halide is reduced to metallic silver in the light-exposed areas and the oxidised colour developer formed in this reaction then couples with a colour coupler and forms image dye. The amount of dye produced is proportional to the amount of silver halide reduced to metallic silver.

Redox amplification processes have been described, for example in British Specification Nos. 1,268,126, 1,399,481, 1,403,418 and 1,560,572. In such processes colour materials are developed to produce a silver image (which may contain only small amounts of silver) and then treated with a redox amplifying solution to form a dye image. The redox amplifying solution contains a reducing agent, for example a colour developing agent, and an oxidising agent which is more powerful than silver halide and which will oxidise the colour developing agent in the presence of the silver image which acts as a catalyst. Oxidised colour developer reacts with a colour coupler (usually contained in the photographic material) to form image dye. The amount of dye formed depends on the time of treatment or the availability of colour coupler rather than the amount of silver in the image as is the case in conventional colour development processes. Examples of suitable oxidising agents include peroxy compounds including hydrogen peroxide, cobalt (III) complexes including cobalt hexammine complexes, and periodates. Mixtures of such compounds can also be used.

Since the amplifying solution contains both an oxidising agent and a reducing agent it is inherently unstable. That is to say unlike a conventional colour developer solution, amplifier solutions will deteriorate in less than a few hours, especially less than one hour, if left in a sealed container. The best reproducibility for such a process has been obtained by using a "one shot" system, where the oxidant is added to the developer and the solution mixed and used immediately (or after a short built in delay) and then discarded. This leads to the maximum solution usage possible with maximum effluent and maximum chemical costs. As a result the whole system is unattractive especially for a minilab environment where minimum effluent is required. It is believed that it is these shortcomings that have inhibited commercial use of this process.

Japanese specification 64/44938 appears to describe such a system in which a silver chloride colour material is processed in a low volume of a single-bath amplifier solution. The processes described therein however fall short of what is required in the fully commercial environment for exactly the reasons given above.

The present invention provides a method and apparatus which can use the minimum processing solution while allowing fully acceptable results and comparatively easy implementation in the minilab environment.

According the the present invention there is provided a method of processing an imagewise exposed photographic material in a processing solution which is unstable to the extent that it deteriorates without external reaction in which said photographic material is passed through a tank containing said solution characterised in that the solution is circulated through the tank at a rate of from 0.1 to 10 tank volumes per minute.

The preferred circulation rate is from 0.5 to 8, especially 1 to 5 and particular from 2 to 4 tank volumes per minute.

In a preferred embodiment of the present method, the processing solution is replenished such that the processing performance of the solution remains within predetermined acceptable limits.

The predetermined acceptable limits are preferably those which are accepted in the trade as desirable as measured in terms of the sensitometric performance of a processed test image.

The time taken for a particular solution to deteriorate can be determined by storing it in a closed container for varying lengths of time before using it to develop photographic material exposed to a test object. The time taken for it to deteriorate sufficiently to give unacceptable results is then readily ascertainable.

The recirculation and/or replenishment is carried out continuously or intermittently. In one method of working both could be carried out continuously while processing was in progress but not at all or intermittently when the machine was idle. Replenishment may be carried out by introducing the required amount of replenisher into the recirculation stream either inside or outside the processing tank.

As will be readily appreciated, even with the features of recirculation and replenishment it is still advantageous to use a tank of relatively small volume. Hence in s preferred embodiment of the present invention the ratio of tank volume to maximum area of material accomodatable therein (i.e. maximum path length × width of material) is less than 11 $dm^3/m^2$, preferably less than 3 $dm^3/m^2$.

The shape and dimensions of the amplifier tank are preferably such that it holds the minimum amount of amplifier solution while still obtaining the required results. The tank is preferably one with fixed sides, the material being advanced therethrough by drive rollers at each end, e.g. as described below. Preferably the photographic material passes through a thickness (or depth) of solution less than 11 mm, preferably less than 5 mm and especially less than 2 mm. The shape of the tank is not critical but it could be in the shape of a shallow tray or, preferably U-shaped. It is preferred that the dimensions of the tank be chosen so that the width of the tank is the same or only just wider than the width of the material to be processed.

In the accompanying drawings:

FIG. 1 is a perspective view of a U-shaped tank,

FIG. 2 is a cross section thereof on the line AA',

FIG. 4 is a diagram of solution circulation and replenishment described in the Example.

Figure 3:
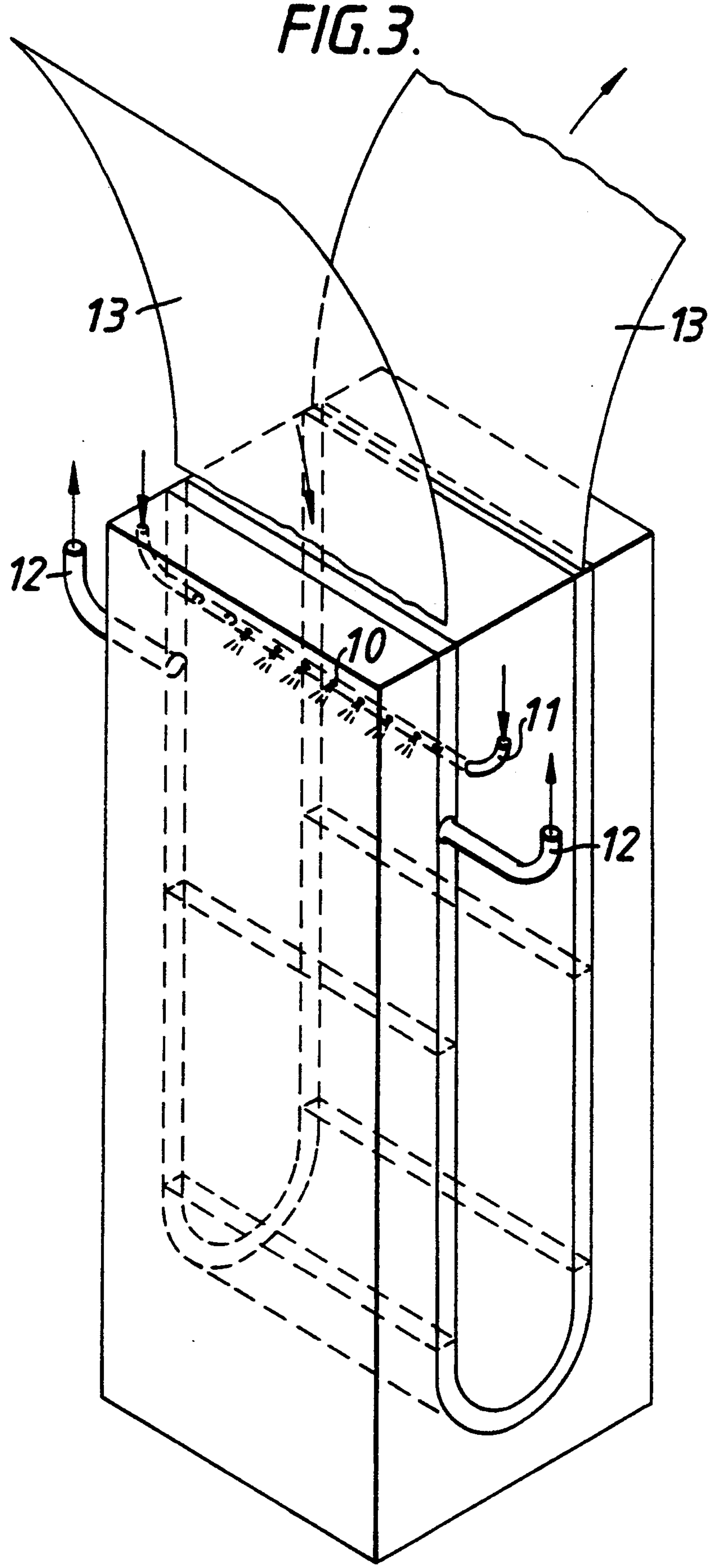
FIG. 3 is a perspective view of the tank used in the Example.

The invention also provides a processing tank for use in the method of the present invention which is U-shaped and of generally rectangular cross-section wherein the spacing between the inner faces of the longer sides thereof is less than 11 mm, preferably less than 5 mm and especially less than 2 mm.

Such a tank is illustrated in FIGS. 1 and 2 of the accompanying drawings in which the tank (1) having an inlet (2) and outlet (3) for the material to be processed. The processing solution enters the tank via inlet means (4) and leaves via outlet means (5) and is circulated by a pump (not shown). The U-shaped tank has an interior of generally rectangular cross-section with a width (measured in the direction of arrow (C))and a thickess (measured in the direction of arrow (B)). The length of the tank is the linear distance from inlet to outlet and this represents the length of photographic material accomodatable in the tank. The photographic material may be moved through the tank by means of drive rollers located at the inlet (2) and outlet 3 (not shown). When a dry photographic material enters the tank its gelatin-based layers begin to take up the processing solution and swell. Especially in the early stages of this process the surface of the material can become tacky and this hinders its smooth passage through the tank. In order to ease its passage through the tank the inner faces of the tank, especially the face adjacent to the emulsion of the photographic material, preferably has textured patterning (shown as (6) in FIG. 2) thereon so as not to present a smooth continuous surface to the emulsion layers. An alternative to this is to attach a plastic mesh to the surface instead of using texturing. Such a mesh preferably has a thickness of about 350 μm and can be formed from any water insoluble plastics material. As an alternative to the texturing/mesh approach the smaller walls of the tank may have a groove formed therein adapted to receive the edges of the photographic material and guide it along the tank while keeping its faces away from the longer tank walls.

The tank is preferably made of such dimensions that it fits into the space occupied by one tank/rack assembly in a conventional minilab processing machine and can operate in conjunction with the remaining tanks in the processor.

As indicated above, the replenishment rate is sufficient to keep the process working to predetermined limits. However it has been found that it is preferable to add replenisher at such a rate that the time taken to add a volume of replenisher equal to at least twice, preferably at least three times, the tank's volume is less than the time taken for the processing solution's performance to deteriorate beyond said predetermined limits of acceptability.

A preferred method of working is wherein the thickness of the tank (t), the processing time (P) and the replenishment rate (R) are such that the time taken to add a volume of replenisher equal to the volume of the tank (tank turn-over, T), defined by the formula:

$$T=t.P/R \text{ (secs) (t in cm, P in sec, R in cc/sq cm)}$$

is less than half the time, and preferably between one fifth and one half the time, that the processing solution takes to deteriorate beyond said predetermined limits.

The recirculation of the amplifier solution can be achieved by pumping as indicated above. It is useful in keeping the processing solution in a state of agitation thus helping to ensure even processing and, as well, can aid the replenishment process. The replenisher is preferably added to the recycling processing solution outside the tank itself.

The amplifier solution may be any such solution which is effective for the purpose required. Such solutions are referred to in our copending application GB 8909580.6.

The colour photographic material to be processed may be a film or paper of any type but will preferably contain low amounts of silver halide. Preferred silver halide coverages are in the range 4–200 mg/m$^2$ (as silver). The material may comprise the emulsions, sensitisers, couplers, supports, layers, additives, etc. described in Research Disclosure, December 1978, Item 17643, published by Kenneth Mason Publications Lid, Dudley Annex, 12*a* North Street, Emsworth, Hants P010 7DQ, U.K.

In a preferred embodiment the photographic material comprises a resin-coated paper support and the emulsion layers comprise more than 80%, preferably more than 90% silver chloride and are more preferably composed of substantially pure silver chloride. Preferably the amplification solution contains hydrogen peroxide and a colour developing agent.

The photographic materials can be single colour materials or multicolour materials. Multicolour materials contain dye image-forming units sensitive to each of the three primary regions of the spectrum. Each unit can be comprised of a single emulsion layer or of multiple emulsion layers sensitive to a given region of the spectrum. The layers of the materials, including the layers of the image-forming units, can be arranged in various orders as known in the art.

A typical multicolour photographic material comprises a support bearing a yellow dye image-forming unit comprised of at least one blue-sensitive silver halide emulsion layer having associated therewith at least one yellow dye-forming coupler, and magenta and cyan dye image-forming units comprising at least one green- or red-sensitive silver halide emulsion layer having associated therewith at least one magenta or cyan dye-forming coupler respectively. The material can contain additional layers, such as filter layers.

The following example is given for a better understanding of the Invention.

EXAMPLE

A conventional negative colour paper based on pure chloride emulsions (appropriately chemically and spectrally sensitised) was coated with the following silver chloride grain sizes at the following silver and coupler coating weights:

| | Silver | Grain size | Coupler |
|---|---|---|---|
| cyan | 0.3 mg/dm$^2$ | 0.40 μ | 4.3 mg/dm$^2$ |
| magenta | 0.4 mg/dm$^2$ | 0.30 μ | 4.3 mg/dm$^2$ |
| yellow | 0.7 mg/dm$^2$ | 0.78 μ | 10.8 mg/dm$^2$ |

The imaging forming couplers were:

Cyan: 2-[α-(2,4-di-tert-amylphenoxy)-butyramido]-4,6-dichloro-5-ethyl-phenol

Magenta: 1-(2,4,6-trichlorophenyl)-3-[5-[α-(3-t-butyl-4-hydroxyphenoxy)tetradecane-amido]-2-chloranilino]-5-pyrazolone Yellow: α-[4-(4-benzyloxophenylsulphonyl)-phenoxy]-α-(pivalyl)-2-chloro-[⊖-(2,4-di-tert -amylpheno)-butyramido]-acetanilide.

The following Processing solutions were prepared:

| | | |
|---|---|---|
| Solution A | | |
| Developer/amplifier | | |
| Sodium sulphite | 1.88 | g |
| Sodium carbonate | 21.0 | g |
| *Developing agent | 7.6 | g |
| **Antical agent | 1.2 | g |
| Diethyl hydroxylamine | 0.74 | g |
| Sodium hydroxide | 2.29 | g |
| Water to | 1 | litre |
| pH | 10.8 | (27° C.) |
| Solution B | | |

-continued

| | | |
|---|---|---|
| 100 VOL Hydrogen peroxide | 400 | ml |
| Water to | 1000 | ml |

*(N-ethyl-N-(2-methanesulphonamidoethyl)-2-methyl-1,4-phenylenediamine) sesquisulphate, monohydrate)
**1-hydroxyethylidene-1,1-diphosphonic acid The processing tank shown in FIG. 3 (fitted with the standard Noritsu feed in and feed out rollers—not shown) was substituted for the first processing rack in a modified Noritsu 801 paper processor such that lengths of paper (13) could be transported through four tanks (the first one being the tank assembly of FIG. 3) arranged to give the following processing times:

| | | |
|---|---|---|
| Development/amplification | 33 sec | at 35° C. |
| Stop bath (2% acetic acid) | 30 sec | |
| Conventional paper bleach/fix (Iron-EDTA) | 45 sec | |
| Wash | 45 sec | |
| Dry | 30 sec. | |

The machine speed was adjustable and set to 2.5 cm/sec (1 inch/sec) The recirculation and replenishment system shown in FIG. 4 was used. The volume of the tank was 104 ml and associated pipe and pumps brought this up to approximately 150 ml total volume. The dimensions of the tank are thickness=1.7 mm, width=12.5 cm and length=50 cm. The delivery of the solution in the tank was via a set of 7 holes (1 mm diam) (10) bored into the inside member and fed at the side from lines (11) and arranged to deliver solution across the width of the web. Solution was removed from the side ports (12) on the opposite side of the web from holes (12).

As shown in FIG. 4, the replenisher (20—solution A) was supplied at a rate of 43 ml/min supplied from a Watson Marlow peristaltic pump (21) and the hydrogen peroxide (22—solution B) was supplied from another similar pump (23) at 0.55 ml/min. The recirculation at 160 ml/min representing approximately 1.6 tank volumes per minute was supplied by a third peristaltic pump The solution A was pumped into the tank and the associated pipework. The recirculation pump (24) was switched on. A "start-up" solution was not used and so flashed lengths of paper described above (but with a lower total silver of 0.9 mg/dm$^2$ and 1.1 m long by 12.5 cm wide) were used to season the solution A in the tank as it was recirculated and replenished with fresh solutions A and B at the rates stated. 21 linear meters of paper was passed through the tank representing about five tank turn overs. Five sensitometric wedges (using red, green and blue exposures) were made on the paper described above, and used through the seasoning run to monitor the condition of the process.

Fairly good uniformity was observed on the flashed coatings and high densities were obtained on the wedge exposures on the paper described above. Dmin values were somewhat higher than desired. A similar experiment carried out without the recirculation gave very poor uniformity and lower densities on the flashed coating and corresponding wedges.

We claim:

1. A method of processing an imagewise exposed photographic material in a processing solution comprising the steps of:

circulating a processing solution through a tank at a rate of 1 to 5 tank volumes per minute, wherein said processing solution comprises a color developing agent and a reducing agent and is unstable to the extent that said processing solution deteriorates without external reaction;

converting said exposed photographic material through said tank, whereby said photographic material is contacted with said processing solution; and replenishing said processing solution.

2. A method as claimed in claim 1 in which the ratio of tank volume to maximum area of material accomodatable therein is less than 11 dm$^3$/m$^2$.

3. A method as claimed in claim 1 in which the thickness of the solution held by the tank is less than about 5 mm.

4. A method as claimed in claim 1 in which the processing solution is replenished such that the processing performance of the solution remains within predetermined acceptable limits.

5. A method as claimed in claim 4 in which replenisher is added at such a rate that the time taken to add a volume of replenisher equal to at least twice the tank's volume is less than the time taken for the processing solution's performance to deteriorate beyond said predetermined acceptable limits.

6. A method as claimed in claim 5 in which replenisher is added at such a rate that the time taken to add a volume of replenisher equal to at least three times the tank's volume is less than the time taken for the processing solution's performance to deteriorate beyond said predetermined acceptable limits.

7. A method as claimed in claim 1 in which the recirculation and/or replenishment is carried out continuously or intermittently.

8. A method as claimed in claim 1 in which the tank is U-shaped and of substantially rectangular cross-section wherein the spacing of the inner faces between the inner faces of the longer sides thereof is less than 11 mm.

9. A method as claimed in claim 1 in which the width of the tank is approximately equal to the width of the photographic material being processed.

10. A method as claimed in claim 7 wherein the thickness of the tank (t), the processing time (P) and the replenishment rate (R) are such that the time taken to add a volume of replenisher equal to the volume of the tank (tank turn-over, T), defined by the formula:

$$T=t.P/R \text{ (secs) (t in cm, P in sec, R in cc/sq cm)}$$

is less than half the time that the processing solution takes to deteriorate beyond said predetermined limits.

11. A method as claimed in claim 10 in which T is between one fifth and one half the time that the processing solution takes to deteriorate beyond said predetermined limits.

12. A method as claimed in claim 1 in which the photographic material comprises substantially pure silver chloride emulsions.

13. A method as claimed in claim 1 in which the processing solution is an amplifier solution comprising a colour developing agent and hydrogen peroxide or a compound which provides hydrogen peroxide.

14. A method according to claim 1, wherein the thickness of said processing solution in said tank is less than about 2 mm.

15. A method according to claim 1, wherein the thickness of said processing solution in said tank is less than about 11 mm.

16. A method according to claim 1, wherein the thickness of said processing solution in said tank is less than about 5 mm.

17. A processing tank comprising:

a U-shaped container having a generally rectangular cross-section with longer sides having inner faces, wherein spacing between said longer sides of said container is less than about 11 mm;

an inlet means;

an outlet means; and a means for circulating liquid through said container at a rate of 1 to 5 tank volumes per minute.

18. A processing tank as claimed in claim 17 in which either:

the faces of the tank adjacent to the emulsion layer of the photographic material are textured or have a mesh attached thereto or the shorter edges of the tank have a groove therein to ease the transport of said material through the tank.

19. A processing tank according to claim 17, wherein said spacing between the inner faces of the longer sides of said container is less than about 5 mm.

20. A processing tank according to claim 17, wherein said spacing between the inner faces of the longer sides of said container is less than about 2 mm.

* * * * *